United States Patent
Fox et al.

(10) Patent No.: US 6,492,673 B1
(45) Date of Patent: Dec. 10, 2002

(54) CHARGE PUMP OR OTHER CHARGE STORAGE CAPACITOR INCLUDING PZT LAYER FOR COMBINED USE AS ENCAPSULATION LAYER AND DIELECTRIC LAYER OF FERROELECTRIC CAPACITOR AND A METHOD FOR MANUFACTURING THE SAME

(75) Inventors: Glen Fox, Colorado Springs, CO (US); Thomas Evans, Colorado Springs, CO (US)

(73) Assignee: Ramtron International Corporation, Colorado Springs, CO (US)

( * ) Notice: Subject to any disclaimer, the term of this patent is extended or adjusted under 35 U.S.C. 154(b) by 0 days.

(21) Appl. No.: 09/862,365

(22) Filed: May 22, 2001

(51) Int. Cl.[7] .............................................. H01L 31/119
(52) U.S. Cl. ........................ 257/303; 257/285; 257/310; 257/532
(58) Field of Search ................................. 257/295, 303, 257/306, 310, 532; 361/303, 311, 313, 330; 438/210, 290, 381

(56) References Cited

U.S. PATENT DOCUMENTS

| 3,935,083 | A | | 1/1976 | Tomozawa et al. |
| 5,024,964 | A | | 6/1991 | Rohrer et al. |
| 5,031,144 | A | | 7/1991 | Persky |
| 5,206,788 | A | * | 4/1993 | Larson et al. ................ 257/295 |
| 5,266,821 | A | | 11/1993 | Chern et al. |
| 5,338,951 | A | | 8/1994 | Argos et al. |
| 5,350,705 | A | | 9/1994 | Brassington et al. |
| 5,475,248 | A | * | 12/1995 | Takenaka ..................... 257/295 |
| 5,789,303 | A | * | 8/1998 | Leung et al. ......... 148/DIG. 14 |
| 5,920,453 | A | * | 7/1999 | Evans et al. ........... 257/29.343 |
| 6,010,927 | A | * | 1/2000 | Jones et al. ................. 438/210 |

FOREIGN PATENT DOCUMENTS

| EP | 0 415 751 A1 | 6/1991 |
| JP | 2-260559 | 1/1991 |
| JP | 5-135999 A | 1/1993 |
| JP | 5-267557 | 1/1994 |

OTHER PUBLICATIONS

Liu et al., "Low–Temperature Fabrication of Amorphous BaTiO3 Thin–Film Bypass Capacitors," IEEE Device Letters (1993) 14:320–322.

* cited by examiner

Primary Examiner—David Nelms
Assistant Examiner—Dao H. Nguyen
(74) Attorney, Agent, or Firm—Hogan & Hartson, LLP

(57) ABSTRACT

A charge storage capacitor includes a bottom electrode, a dielectric layer formed on the bottom electrode, and a local interconnect electrode formed on the dielectric layer, wherein the dielectric layer is an encapsulation layer, and a ferroelectric memory cell includes the charge storage capacitor.

7 Claims, 9 Drawing Sheets

```
     412a ─┤ PZT-F │                     413b ─┤  TE   │
                                         412b ─┤ PZT-F │
411 ——                              411 ——
441 ——                              441 ——
        410a                                410b
```

FIG. 4C

CHARGE PUMP OR OTHER CHARGE STORAGE CAPACITOR INCLUDING PZT LAYER FOR COMBINED USE AS ENCAPSULATION LAYER AND DIELECTRIC LAYER OF FERROELECTRIC CAPACITOR AND A METHOD FOR MANUFACTURING THE SAME

BACKGROUND OF THE INVENTION

1. Field of the Invention

The present invention relates to a charge storage capacitor and more particularly, to a charge storage capacitor including an encapsulation layer that can also function as a dielectric layer of the charge storage capacitor.

2. Discussion of the Related Art

Integrated circuit ferroelectric memory devices include an integrated circuit substrate which includes a cell region and a periphery region. A plurality of ferroelectric memory cells are formed in the cell region, including a plurality of ferroelectric capacitors. The ferroelectric capacitor in the ferroelectric memory cell includes a dielectric material that has a high dielectric constant and that can be polarized by an electric field, thus storing a memory data state. A polarization of the dielectric material remains until reversed by an opposite electrical field. This makes the dielectric memory cell non-volatile.

Conventionally, capacitors with a single ferroelectric layer, such as a PZT-F layer (ferroelectric layer formed of PZT (lead zirconate titanate)), are used for making both switchable ferroelectric capacitors (data storage capacitors) and charge pump capacitors or other charge storage capacitors. However, it is very difficult to optimize the ferroelectric properties of a ferroelectric layer, such as a PZT-F layer, for high permittivity capacitor applications such as charge pumps or other charge storage capacitors. Further, conventionally, an encapsulation layer, such as a PZT-E layer (encapsulation layer formed of PZT (lead zirconate titanate)) is utilized only for encapsulating and protecting the underlying ferroelectric capacitor including the PZT-F layer.

SUMMARY OF THE INVENTION

Accordingly, the present invention is directed to a charge storage capacitor that substantially obviates one or more of the problems due to limitations and disadvantages of the related art.

An object of the present invention is to provide an improved charge storage capacitor.

Another object of the present invention is to provide a capacitor including a dielectric layer that is easy to optimize for both encapsulation and high permittivity dielectric properties.

Another object of the present invention is to provide a capacitor having a high charge storage capability that has low leakage current and relatively linear capacitance dependence on voltage.

Another object of the present invention is to provide an integrated circuit, including an improved charge storage and a ferroelectric memory cell, having a simple manufacture process.

Additional features and advantages of the invention will be set forth in the description, which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a charge storage capacitor includes a bottom electrode, a dielectric layer formed on the bottom electrode, and a local interconnect electrode formed on the dielectric layer.

In another aspect of the present invention, an integrated circuit including a capacitor includes a bottom, a first dielectric layer formed on the bottom electrode, a top electrode formed on the first dielectric layer, a second dielectric layer formed on the top electrode, wherein the second dielectric layer completely covers the top electrode, and a local interconnect electrode formed on the second dielectric layer.

In another aspect of the present invention, a charge storage capacitor includes a bottom electrode, a first dielectric layer formed on the bottom electrode, a second dielectric layer formed on the first dielectric layer, and a local interconnect electrode formed on the second dielectric layer.

In another aspect of the present invention, a method for forming a capacitor, includes the steps of forming a bottom electrode, forming an encapsulation layer on the bottom electrode, and forming a local interconnect electrode on the encapsulation layer.

In another aspect of the present invention, a method for forming an integrated circuit, comprising a charge storage capacitor and a ferroelectric memory cell including a data storage capacitor, includes the steps of forming a bottom electrode of the charge storage capacitor and a bottom electrode of the data storage capacitor on an integrated circuit, forming a ferroelectric layer on the bottom electrode of the data storage capacitor, forming a top electrode on the ferroelectric layer, forming a first encapsulation layer on the bottom electrode of the charge storage capacitor and a second encapsulation layer on the bottom electrode of the data storage capacitor including the ferroelectric layer and the top electrode, wherein the first encapsulation layer and the second encapsulation are formed simultaneously, and forming a first interlayer dielectric layer on the first encapsulation layer and a second interlayer dielectric layer on the second encapsulation layer, wherein the first encapsulation layer is a dielectric layer of the charge storage capacitor.

In another aspect of the present invention, a method for forming an integrated circuit comprising a capacitor, includes the steps of forming a bottom electrode, forming a ferroelectric layer on the bottom electrode, forming a top electrode on the ferroelectric layer, forming an encapsulation layer on the top electrode, wherein the encapsulation layer completely covers the top electrode, and forming a local interconnect electrode on the encapsulation layer, wherein the ferroelectric layer includes PZT.

In another aspect of the present invention, a method for forming an integrated circuit, comprising a charge storage capacitor and a ferroelectric memory cell including a data storage capacitor, includes the steps of forming a bottom electrode of the charge storage capacitor and a bottom electrode of the data storage capacitor on an integrated circuit substrate, forming a first ferroelectric layer on the bottom electrode of the charge storage capacitor and a second ferroelectric layer on the bottom electrode of the data storage capacitor, forming a first top electrode on the first ferroelectric layer and a second top electrode on the second ferroelectric layer, forming a first encapsulation layer on the bottom electrode of the charge storage capacitor, including the first ferroelectric layer and the first top layer, forming a second encapsulation layer on the bottom electrode of the data storage capacitor, including the second ferroelectric layer and the second top layer, wherein the first encapsulation layer and the second encapsulation are formed simultaneously, forming a first interlayer dielectric layer on the first encapsulation layer and a second interlayer dielectric layer on the second encapsulation layer, etching the first interlayer dielectric layer to form a first opening to expose the first encapsulation layer, etching the second interlayer dielectric layer and the second encapsulation layer to form a second opening to expose the top electrode of the data storage capacitor, and forming a first local interconnect electrode in the first opening and a second local interconnect electrode in the second opening, simultaneously, wherein the first local interconnect electrode comprises part of the charge storage capacitor.

In another aspect of the present invention, a method for forming a capacitor, includes the steps of forming a bottom electrode, forming a ferroelectric layer on the bottom electrode, forming an encapsulation layer on the ferroelectric layer, and forming a local interconnect electrode on the encapsulation layer.

In another aspect of the present invention, a method for forming an integrated circuit, comprising a charge storage capacitor and a ferroelectric memory cell including a data storage capacitor, includes the steps of forming a bottom electrode of the charge storage capacitor and a bottom electrode of the data storage capacitor on an integrated circuit substrate, forming a first ferroelectric layer on the bottom electrode of the charge storage capacitor and a second ferroelectric layer on the bottom electrode of the data storage capacitor, forming a top electrode layer on the first and second ferroelectric layers, etching the top electrode layer to remove from the first ferroelectric layer and to form a top electrode of the data storage capacitor on the second ferroelectric layer, forming a first encapsulation layer on the bottom electrode of the charge storage capacitor including the first encapsulation layer and a second encapsulation layer on the bottom electrode of the data storage capacitor including the second ferroelectric layer and the top electrode, and forming a first interlayer dielectric layer on the first encapsulation layer and a second interlayer dielectric layer on the second encapsulation layer, wherein the first encapsulation layer and the second encapsulation are formed simultaneously.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate embodiments of the invention and together with the description serve to explain the principles of the invention. In the drawings:

FIGS. 4A–4F are sequential cross sectional views of an integrated circuit including a charge storage capacitor according to a third embodiment of the present invention.

DETAILED DESCRIPTION OF THE PREFERRED EMBODIMENTS

Reference will now be made in detail to the preferred embodiments of the present invention, examples of which are illustrated in the accompanying drawings.

Figure 1:
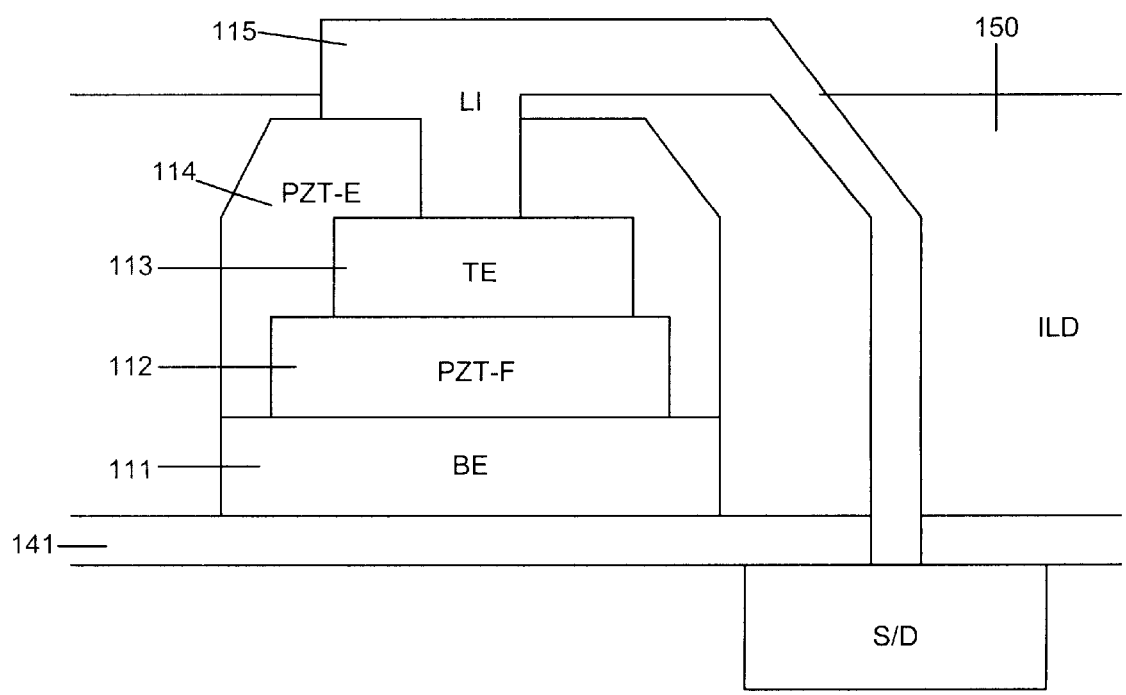
FIG. 1 is a cross sectional view of a ferroelectric memory cell.

FIG. 1 shows a cross sectional view of a typical ferroelectric memory cell structure including a ferroelectric capacitor, which stores a memory data state. The ferroelectric capacitor includes a bottom electrode (BE) 111, a PZT-F layer 112, and a top electrode (TE) 113. The ferroelectric memory cell further includes an encapsulation PZT (PZT-E) layer 114 formed on the ferroelectric capacitor to protect the underlying capacitor from being damaged during etching of the bottom electrode 111. Once the etching of the bottom electrode is finished, an interlevel dielectric (ILD) layer 150 is deposited. Thereafter, the interlevel dielectric layer 150 and the PZT-E layer 114 are etched to form an opening so that a local interconnect electrode (LI) 115 can be formed to be in contact with the top electrode 113 through the opening.

FIGS. 2A–2E show sequential cross sectional views of an integrated circuit including a charge storage capacitor according to a first embodiment of the present invention. The integrated circuit includes the charge storage capacitor of the present invention and a ferroelectric memory cell including a ferroelectric capacitor (data storage capacitor). The charge storage capacitor of the present invention and the data storage capacitor are formed simultaneously on an integrated circuit substrate by using the same process sequence.

Figure 2A:
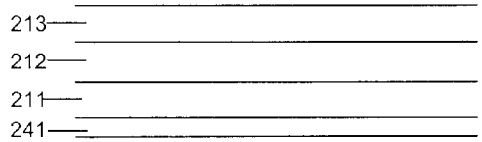
FIGS. 2A–2F are sequential cross sectional views of an integrated circuit including a charge storage capacitor according to a first embodiment of the present invention.
Figure 2A:
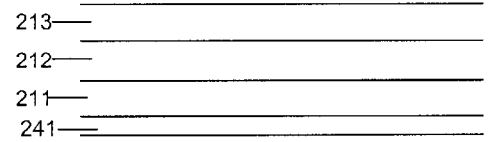

FIG. 2A shows the integrated circuit including a section 210a, where the charge storage capacitor of the present invention is to be formed, and a section 210b, where the ferroelectric capacitor (data storage capacitor) is to be formed. The integrated circuit shown in FIG. 2A includes a CMOS underlayer coated with $SiO_2$ or other interlayer dielectric layer 241, with an adhesion layer (not shown) formed thereon, and a bottom electrode layer 211 deposited thereon. The adhesion layer can be formed of Ti or $TiO_x$ having a thickness of about 20 nm, for example. The bottom electrode layer can be made of Pt (Platinum) having a thickness of about 100 nm, for example. On the bottom electrode layer 211, a PZT-F 212 is deposited to a thickness in a range of between 150–200 nm. Then, a top electrode layer 213 is deposited to a thickness of 150 nm, for example.

Figure 2B:
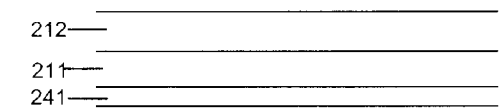
Figure 2B:
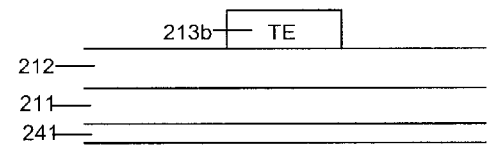

Thereafter, the top electrode layer 213 in 210b is patterned by photolithography and reactive ion etching to form a top electrode (TE) 213b of the data storage capacitor. The top electrode layer 213 in 210a is completely removed by the reactive ion etching (RIE), as shown in FIG. 2B.

Figure 2C:
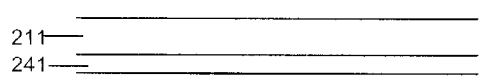
Figure 2C:
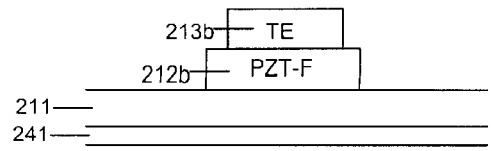

Thereafter, the PZT-F layer 212 in 210b is patterned by photolithography and reactive ion etching to form a PZT-F layer 212b. Simultaneously, the PZT-F 212 in 210a is completely removed by reactive ion etching, thus leaving a clean bottom electrode layer surface in 210a, as shown in FIG. 2C.

Figure 2D:
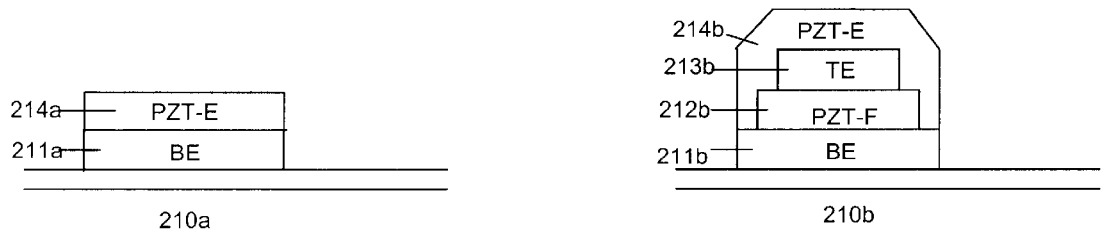

Then, an encapsulation layer formed of PZT (PZT-E layer) 214 is formed to a thickness in a range of between 30 to 200 nm, for example. Thereafter, the PZT-E layer 214 is patterned by photolithography and reactive ion etching to form a dielectric layer 214a of the charge storage capacitor and an encapsulation layer 214b of the data storage capacitor. Also, the bottom electrode layer 211 is patterned by photolithography and reactive ion etching to form a bottom electrode 211a of the charge storage capacitor and a bottom electrode 211b of the data storage capacitor, as shown in FIG. 2D.

Figure 2E:
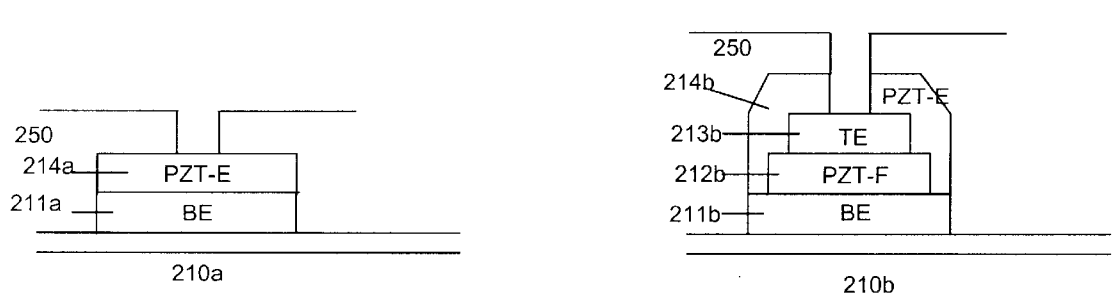

Once the bottom electrodes 211a and 211b and the PZT-E layers 214a and 214b are formed, an interlayer dielectric layer 250 is deposited. Thereafter, the interlayer dielectric layer 250 and the PZT-E layer 214b formed on the data storage capacitor in 210b are etched through to form an opening to provide access to the top electrode 213b of the data storage capacitor. Simultaneously, the interlayer dielectric layer 250 formed in 210a is etched, without etching the PZT-E layer 214a, to form an opening therein, as shown in FIG. 2E.

Figure 2F:
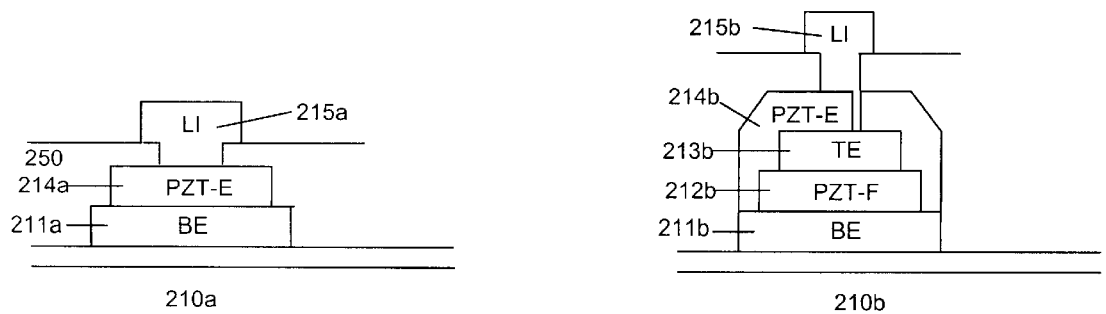

Thereafter, a local interconnect layer 215 is deposited and patterned by photolithography and reactive ion etching to form a local interconnect electrode 215b of the ferroelectric memory cell in 210b and a local interconnect electrode 215a of the charge storage capacitor in 210a, simultaneously, as shown in FIG. 2F. The local interconnect electrode 215a is also a second electrode of the charge storage capacitor. The local interconnect layer can be made of conductive materials, such as TiN and Al, for example.

In this embodiment, the charge storage capacitor includes the encapsulation PZT (PZT-E) layer 214a as a dielectric layer of the capacitor. Further, in this embodiment, the bottom electrode (BE) 211a is used as a first electrode and the local interconnect layer (LI) 215a is used as a second electrode of the charge storage capacitor.

The PZT-E layer 214 can be formed by electron beam deposition, flash deposition, ion plating, Rf-magnetron sputtering, ion beam sputtering, laser ablation, molecular beam epitaxy (MBE), chemical vapor deposition (CVD), plasma CVD or MOCVD, or sol-gel method. By depositing the PZT layer with properly adjusted Pb concentration with high temperature deposition, up to 700° C., or by changing deposited Pb concentration, enhanced linear dielectric response and reduced leakage current can be provided. Further, as part of the manufacture process, it is also possible to plasma damage the PZT layer during the etching of the bottom electrode layer and the PZT-E layer, thereby improving the linear dielectric performance of the PZT layer.

FIGS. 3A–3G show sequential cross sectional views of an integrated circuit including a charge storage capacitor according to a second embodiment of the present invention. The charge storage capacitor and a ferroelectric capacitor (data storage capacitor) are formed simultaneously on an integrated circuit substrate by using the same process sequence.

Figure 3A:
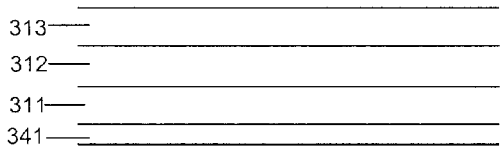
FIGS. 3A–3F are sequential cross sectional views of an integrated circuit including a charge storage capacitor according to a second embodiment of the present invention.
Figure 3A:
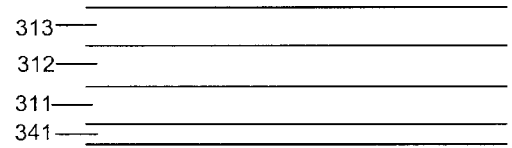
Figure 3B:
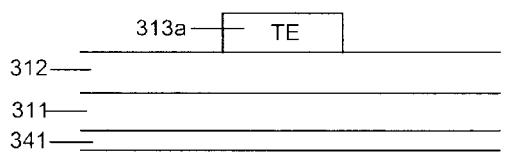
Figure 3B:
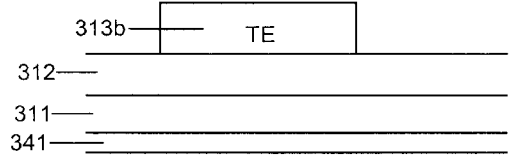

FIG. 3A shows the integrated circuit including a section 310a, where the charge storage capacitor is to be formed, and a section 310b, where the data storage capacitor is to be formed. The integrated circuit shown in FIG. 3A includes a CMOS underlayer coated with $SiO_2$ or other interlayer dielectric layer 341, with an adhesion layer (not shown) formed thereon, and a bottom electrode layer 311 deposited thereon. The adhesion layer can be formed of Ti or $TiO_x$ having a thickness of about 20 nm, for example. The bottom electrode layer can be made of Pt (Platinum) having a thickness of about 100 nm, for example. On the bottom electrode layer 311, a PZT-F 312 is deposited to a thickness in a range of between 150–200 nm. Then, a top electrode layer 313 is deposited to a thickness of 150 nm, for example. Thereafter, the top electrode layer 313 is patterned by photolithography and reactive ion etching to form a top electrode (TE) 313a of the charge storage capacitor and a top electrode (TE) 313b of the data storage capacitor, as shown in FIG. 3B.

Figure 3C:
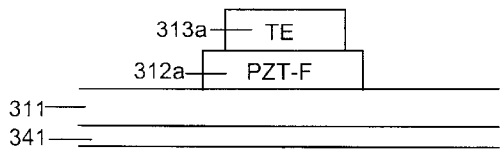
Figure 3C:
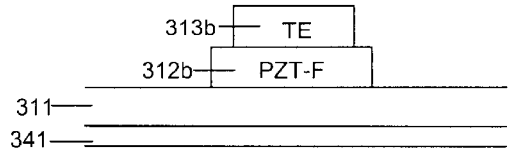

Thereafter, the PZT-F 312 layer in 310b is patterned by photolithography and reactive ion etching to form a PZT-F layer 312b. Simultaneously, the PZT-F 312 in 310a is patterned by photolithography and reactive ion etching to form a PZT-F layer 312a, as shown in FIG. 3C. An area of the PZT-F layer 312a must be larger than an area of the charge storage capacitor.

Figure 3D:
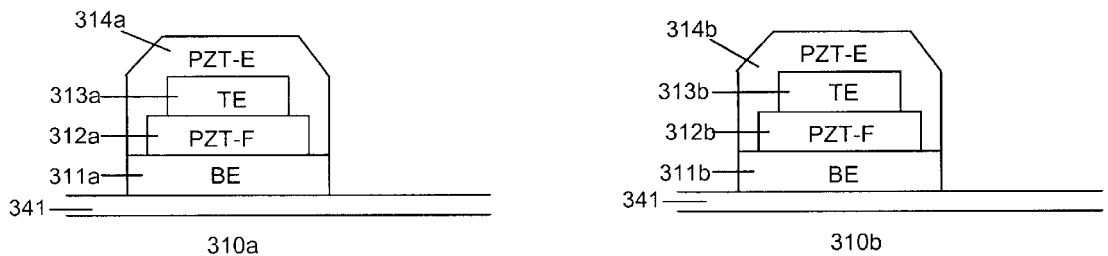

Then, a PZT-E layer 314 is formed to a thickness in a range of between 30 to 200 nm, for example. Thereafter, the PZT-E layer 314 is patterned by photolithography and reactive ion etching to form a dielectric layer 314a of the charge storage capacitor and an encapsulation layer 314b of the data storage capacitor. Also, the bottom electrode layer 311 is patterned by photolithography and reactive ion etching to form a bottom electrode 311a of the charge storage capacitor and a bottom electrode 311b of the data storage capacitor, as shown in FIG. 3D. An area of the PZT-E layer 314a and the bottom electrode (BE) 311a of the charge storage capacitor must be longer than an area of the shorter of the two electrodes constituting the charge storage capacitor.

Figure 3E:
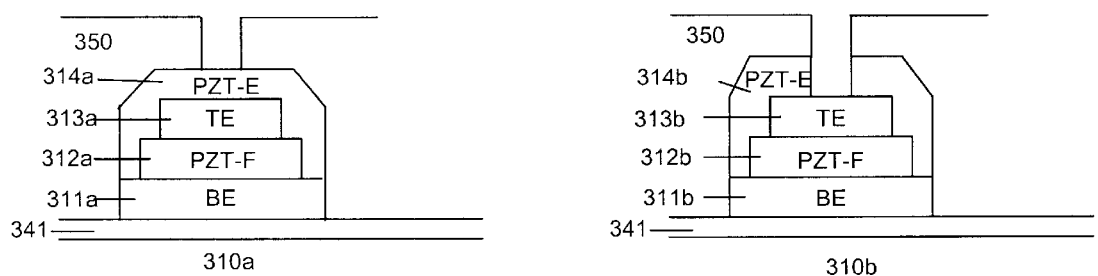

Once the bottom electrodes 311a and 311b and the PZT-E layers 314a and 314b are formed, an interlayer dielectric layer 350 is deposited. Thereafter, the interlayer dielectric layer 350 and the PZT-E layer 314b formed on the data storage capacitor in 310b are etched through to form an opening to provide access to the top electrode 313b of the data storage capacitor. Simultaneously, the interlayer dielectric layer 350 formed in 310a is etched, without etching the PZT-E layer 314a, to form an opening therein, as shown in FIG. 3E.

Figure 3F:
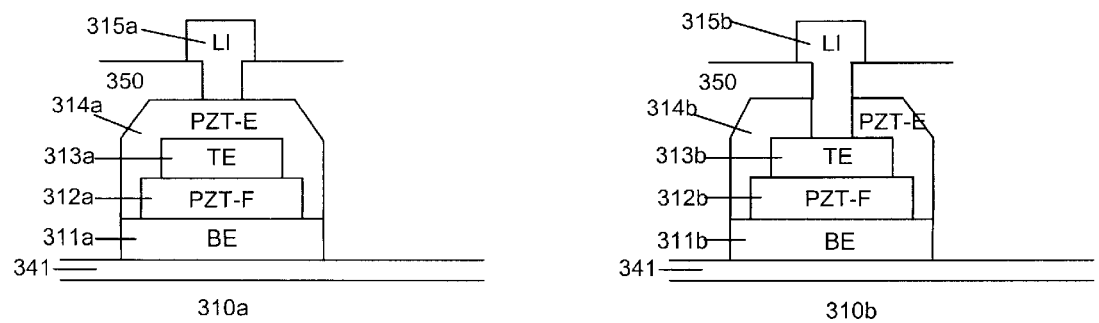

Thereafter, a local interconnect layer 315 is deposited and patterned by photolithography and reactive ion etching to formed a local interconnect electrode (LI) 315b of the ferroelectric memory cell in 310b and a local interconnect electrode 315a of the charge storage capacitor in 310a, as shown in FIG. 3F. The local interconnect electrode 315a of the charge storage capacitor is also a second electrode of the charge storage capacitor. The local interconnect layer can be made of conductive materials, such as TiN and Al, for example.

In this embodiment, the charge storage capacitor includes the top electrode 313a, the PZT-E layer 314a, and the local interconnect electrode 315a formed on the bottom electrode 311a and the PZT-F layer 312a. In this embodiment, the bottom electrode 311a and the PZT-F layer 312a remain as part of the capacitor structure, but they are electrically isolated from the rest of the charge storage capacitor. There is an electrical connection to the top electrode 313a, but there is no electrical connection to the bottom electrode 311a, thus neither the bottom electrode 314a nor the PZT-F layer 312a has any electrical function in the charge storage capacitor.

FIGS. 4A–4G show sequential cross sectional views of an integrated circuit including a charge storage capacitor according to a third embodiment of the present invention. The charge storage capacitor and a ferroelectric capacitor (data storage capacitor) are formed simultaneously on an integrated circuit substrate by using the same process sequence.

FIG. 4A shows the integrated circuit including a section 410a, where the charge storage capacitor is to be formed, and a section 410b, where the data storage capacitor is to be formed. The integrated circuit shown in FIG. 4A includes a CMOS underlayer coated with $SiO_2$ or other interlayer dielectric layer 441, with an adhesion layer (not shown) formed thereon, and a bottom electrode layer 411 deposited thereon. The adhesion layer can be formed of Ti or $TiO_x$ having a thickness of about 20 nm, for example. The bottom electrode layer can be made of Pt (Platinum) having a thickness of about 100 nm, for example. On the bottom electrode layer 411, a PZT-F 412 is deposited to a thickness in a range of between 150–200 nm. Then, a top electrode layer 413 is deposited to a thickness of 150 nm, for example.

Thereafter, the top electrode layer 413 in 410b is patterned by photolithography and reactive ion etching to form a top electrode 413b of the data storage capacitor and the top electrode layer 413 in 410a is removed by reactive ion etching, as shown in FIG. 4B.

Thereafter, the PZT-F 412 in 410b is patterned by photolithography and reactive ion etching to form PZT-F layers 412a and 412b, as shown in FIG. 4C.

Figure 4D:
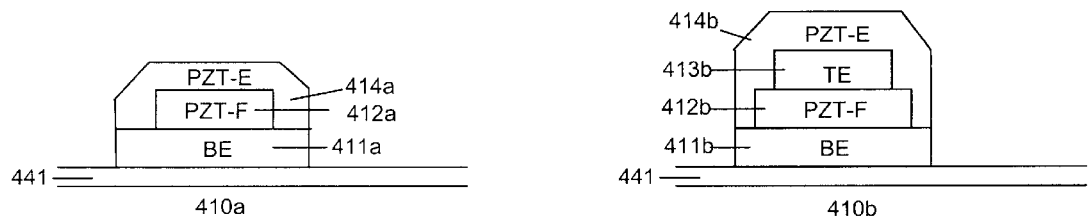
Figure 4E:
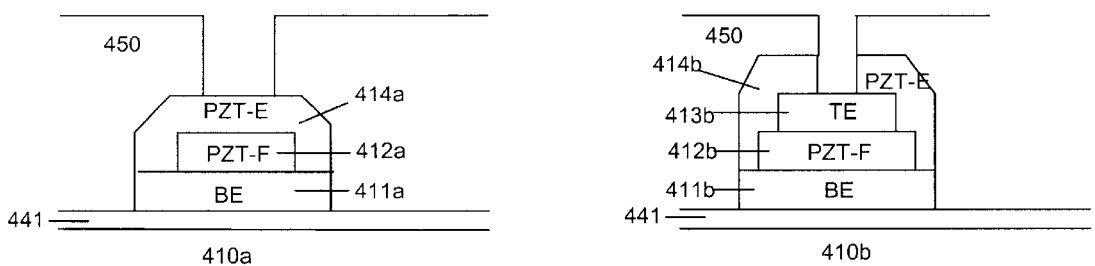

Then, a PZT-E layer 414 is formed to a thickness in a range of between 30 to 200 nm, for example. Thereafter, the PZT-E layer 414 is patterned by photolithography and reactive ion etching to form 414a and 414b. Also, the bottom electrode layer 411 is patterned by photolithography and reactive ion etching to form a bottom electrode 411a of the charge storage capacitor and a bottom electrode 411b of the data storage capacitor, as shown in FIG. 4D.

Figure 4F:
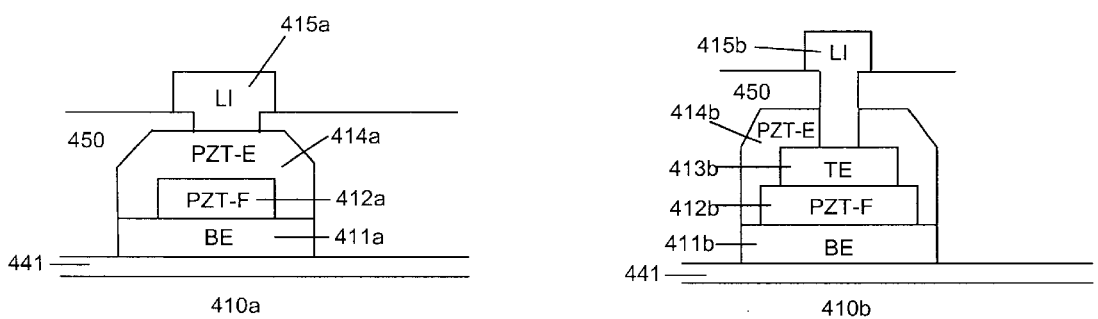

Once the bottom electrodes 411a and 411b and the PZT-E layers 414a and 414b are formed, an interlayer dielectric layer 450 is deposited. Thereafter, the interlayer dielectric layer 450 and the PZT-E layer 414b formed on the data storage capacitor in 410b are etched through to form an opening to provide access to the top electrode 413b of the data storage capacitor. Simultaneously, the interlayer dielectric layer 450 formed in 410a is etched, without etching the PZT-E layer 414a, to form an opening therein, as shown in FIG. 4F.

Thereafter, a local interconnect layer 415 is deposited and patterned by photolithography and reactive ion etching to form a local interconnect electrode 415b of the ferroelectric memory cell in 410b and a local interconnect electrode 415a of the charge storage capacitor in 410a, as shown in FIG. 4G. The local interconnect electrode 415a is also a second electrode of the charge storage capacitor. The local interconnect layer can be made of conductive materials, such as TiN and Al, for example.

In this embodiment, the charge storage capacitor includes both the PZT-F layer and the PZT-E layer as a dielectric layer of the capacitor. Since the PZT-E layer can be easily optimized for better charge storage characteristics, such as voltage linearity, for example, than the PZT-F layer, the combined PZT-F and PZT-E layers will improve the capacitor performance of the charge storage capacitor in comparison with using the PZT-F layer alone.

In a method for forming the PZT-E layer and the PZT-F layer, in addition to using different processes, different compositions, which include changing the concentrations of Pb, Zr, and/or Ti, as well as dopant concentrations, can be used. For example, the PZT-E layer can be deposited with a lower Pb concentration than that of the PZT-F layer, thereby providing the layer with reduced leakage current without a dramatic decrease in permittivity. As part of the processing, it is also possible to plasma damage the PZT-E layer during the top electrode, bottom electrode, PZT-E, and PZT-F etching processes, thereby improving the linear dielectric performance of the PZT-E layer.

FIGS. 5A–5G show sequential cross sectional views of an integrated circuit including a charge storage capacitor according to a fourth embodiment of the present invention. The charge storage capacitor and a ferroelectric capacitor (data storage capacitor) are formed simultaneously on an integrated circuit substrate by using the same process sequence.

Figure 5A:
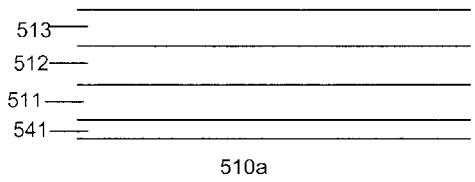
FIGS. 5A–5F are sequential cross sectional views of an integrated circuit including a charge storage capacitor according to a fourth embodiment of the present invention.
Figure 5A:
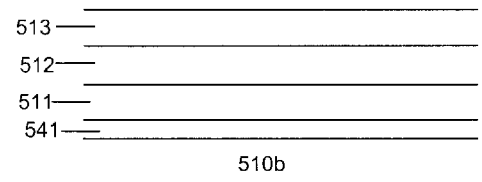

FIG. 5A shows the integrated circuit including a section 510a, where the charge storage capacitor is to be formed, and a section 510b, where the data storage capacitor is to be formed. The integrated circuit shown in FIG. 5A includes a CMOS underlayer coated with $SiO_2$ or other interlayer dielectric layer 541, with an adhesion layer (not shown) formed thereon, and a bottom electrode layer 511 deposited thereon. The adhesion layer can be formed of Ti or $TiO_x$ having a thickness of about 20 nm, for example. The bottom electrode layer can be made of Pt (Platinum) having a thickness of about 100 nm, for example. On the bottom electrode layer 511, a PZT-F 512 is deposited to a thickness in a range of between 150–200 nm. Then, a top electrode layer 513 is deposited to a thickness of 150 nm, for example.

Figure 5B:
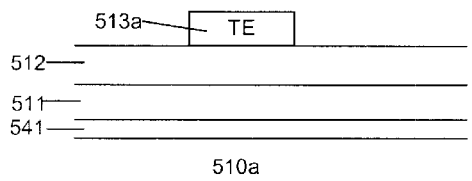
Figure 5B:
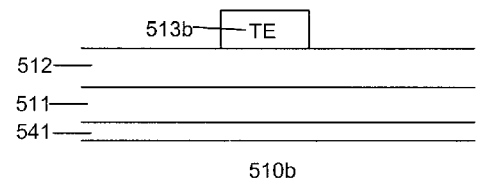

Thereafter, the top electrode layer 513 is patterned by photolithography and reactive ion etching to form a top electrode 513b of the data storage capacitor and a top electrode 513a of the charge storage capacitor, as shown in FIG. 5B.

Figure 5C:
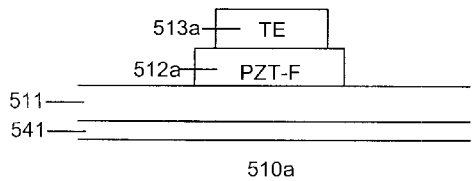
Figure 5C:
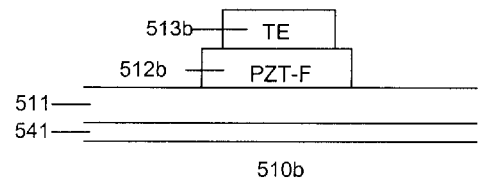

Thereafter, the PZT-F 512 in 510b is patterned by photolithography and reactive ion etching to form a PZT-F layer 513b. Simultaneously, the PZT-F 513 in 510a is patterned by photolithography and reactive ion etching to form a PZT-F layer 513a, as shown in FIG. 5C.

Figure 5D:
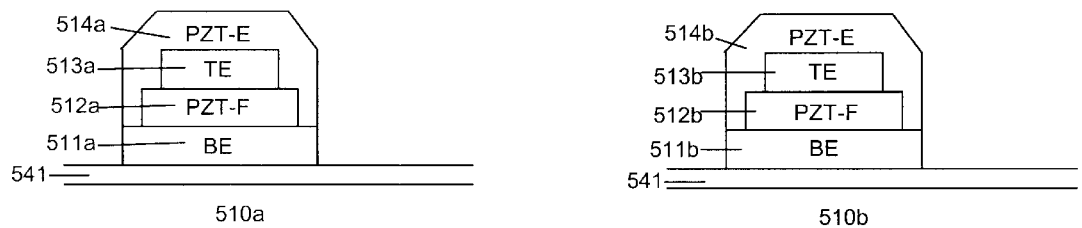
Figure 5E:
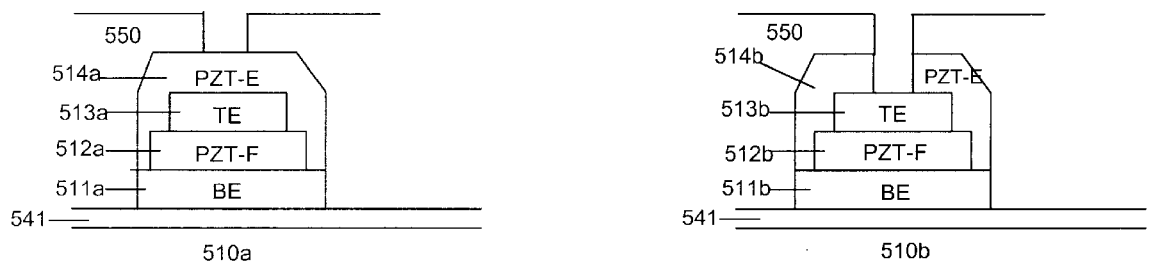

Then, a PZT-E layer 514 is formed to a thickness in a range of between 30 to 200 nm, for example. Thereafter, the PZT-E layer 514 is patterned by photolithography and reactive ion etching to form an encapsulation layer 514b of the data storage capacitor and a dielectric layer 514a of the charge storage capacitor. Also, the bottom electrode layer 511 is patterned by photolithography and reactive ion etching to form a bottom electrode 511a of the charge storage capacitor and a bottom electrode 511b of the data storage capacitor, as shown in FIG. 5D.

Once the bottom electrodes 511a and 511b and the PZT-E layers 514a and 514b are formed, an interlayer dielectric layer 550 is deposited.

Figure 5F:
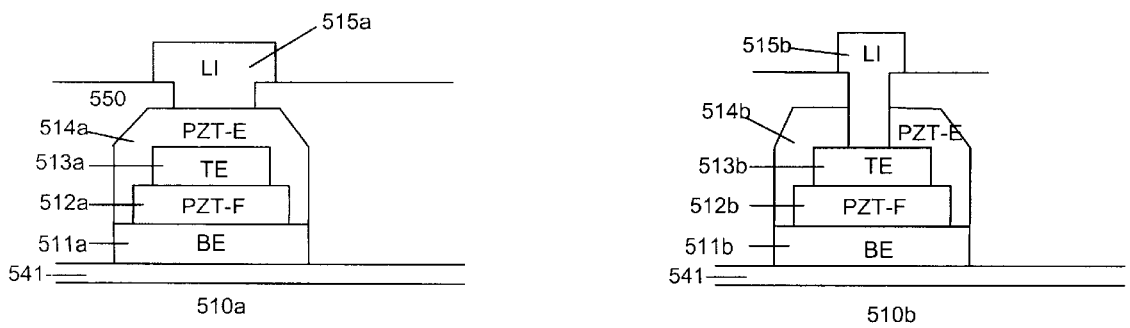

Thereafter, the interlayer dielectric layer 550 and the PZT-E layer 514b formed on the data storage capacitor in 510b are etched through to form an opening to provide access to the top electrode 513b of the data storage capacitor. Simultaneously, the interlayer dielectric layer 550 formed on the charge storage capacitor in 510a is etched, without etching the PZT-E layer 514a, to form an opening therein, as shown in FIG. 5F.

Thereafter, a local interconnect layer 515 is deposited and patterned by photolithography and reactive ion etching to formed a local interconnect electrode 515b of the ferroelectric memory cell in 510b and a local interconnect electrode 515a of the charge storage capacitor in 510a, as electrode of the charge storage capacitor. The local interconnect layer can be made of conductive materials, such as TiN and Al, for example.

The charge storage capacitor in this embodiment has a similar structure to the structure of the second embodiment of the present invention, except for the bottom electrode 511a being a first electrode of the charge storage capacitor in this embodiment. The charge storage capacitor in this embodiment includes both the PZT-F layer 512a and the PZT-E layer 514a, with the bottom electrode 511a being the first electrode and the local interconnect electrode 515a being the second electrode of the charge storage capacitor. In this embodiment, there is no electrical connection to the top electrode 513a. The top electrode 513a is effectively a floating electrode. Effectively, there are two capacitors connected in series. The entire stack, including the bottom electrode 511a, the PZT-F layer 512a, the top electrode 513a, the PZT-E layer 514a, and the local interconnect electrode 515a, is electrically active. The charge storage capacitor of this embodiment provides improved linearity and higher breakdown voltage in comparison with a capacitor formed with only a PZT-F layer.

In the present invention, the PZT-E layer can be replaced with other materials, such as other Pb-based perovskite dielectrics, aluminum oxide, tantalum oxide, $BaTiO_3$, or other dielectrics, for example.

The charge storage capacitor of the present invention can be used as part of the ferroelectric memory cell or as part of the circuitry in the periphery outside the ferroelectric memory cell.

By using the structures and the methods described above, a memory cell with an encapsulation layer and a charge storage capacitor using the encapsulation layer as a dielectric can be formed simultaneously, thus providing a simplified manufacturing process. Further, by using the structures and the methods described above, charge pumps or other charge storage apacitors having a high permittivity dielectric can be formed.

It will be apparent to those skilled in the art that various modifications and variations can be made in the charge storage capacitor of the present invention without departing from the spirit or scope of the invention. Thus, it is intended that the present invention covers the modifications and variations of this invention if they come within the scope of any claims and their equivalents.

What is claimed is:

1. An integrated circuit comprising:

a data storage capacitor and a charge storage capacitor, wherein a bottom electrode layer forms a bottom electrode of the data storage capacitor and the charge storage capacitor;

a first dielectric layer is formed on the bottom electrode of the data storage capacitor;

a data storage capacitor top electrode is formed on the first dielectric layer;

a second dielectric layer is formed on the bottom electrode of the charge storage capacitor and substantially covers the data storage capacitor top electrode; and a local interconnect electrode layer is formed for contacting the data storage top electrode and for forming a charge storage capacitor top electrode.

2. The integrated circuit according to claim 1, wherein the second dielectric layer is an encapsulation layer.

3. The integrated circuit according to claim 2, wherein the encapsulation layer includes PZT.

4. The integrated circuit according to claim 2, wherein the encapsulation layer includes Pb-based perovskite dielectrics, aluminum oxide, tantalum oxide, $BaTiO_3$, or other dielectrics.

5. The integrated circuit according to claim 1, wherein the bottom electrode is electrically isolated.

6. The integrated circuit according to claim 1, wherein the data storage capacitor comprises part of a ferroelectric memory cell.

7. The integrated circuit according to claim 1, wherein the integrated circuit further comprises a ferroelectric memory cell.

* * * * *